: US 10,132,866 B2
(45) Date of Patent: Nov. 20, 2018

(54) METHOD FOR TESTING A LATCHING SOLENOID OF A SWITCH AND TESTING DEVICE FOR CARRYING OUT THE METHOD

(71) Applicant: Siemens Aktiengesellschaft, Munich (DE)

(72) Inventors: Andreas Fischer, Amberg (DE); Stefan Widmann, Freudenberg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 14/608,499

(22) Filed: Jan. 29, 2015

(65) Prior Publication Data

US 2015/0285864 A1    Oct. 8, 2015

(30) Foreign Application Priority Data

Apr. 3, 2014    (DE) .................. 10 2014 206 367

(51) Int. Cl.
 *G01R 31/333*    (2006.01)
 *H01H 47/00*    (2006.01)
 (Continued)

(52) U.S. Cl.
 CPC ....... *G01R 31/333* (2013.01); *G01R 31/3278* (2013.01); *H01H 47/002* (2013.01);
 (Continued)

(58) Field of Classification Search
 CPC .......................... G01R 31/327; G01R 31/333
 (Continued)

(56) References Cited

U.S. PATENT DOCUMENTS 5,200,873 A * 4/1993 Glennon ................... 361/45
2005/0212522 A1* 9/2005 Finlay, Sr.
(Continued)

FOREIGN PATENT DOCUMENTS

CN        1938796      3/2007
CN      101080790     11/2007
(Continued)

OTHER PUBLICATIONS

German Office Action dated Nov. 4, 2014 for corresponding DE Application No. 102014206367.1.
(Continued)

*Primary Examiner* — Walter L Lindsay, Jr.
*Assistant Examiner* — Milton Gonzalez
(74) *Attorney, Agent, or Firm* — Harness, Dickey & Pierce, P.L.C.

(57) ABSTRACT

A method is disclosed for testing a latching solenoid of a switch and a testing device for carrying out the method is disclosed. The switch includes a switching contact, formed by contact elements mechanically separated from one another when the switching contact is open; an electronic trip unit, to respectively monitor the current passing via the contact elements and test whether a current-dependent tripping condition is satisfied; and an actuator, to separate contact elements after actuation, the trip unit actuating the actuator via the latching solenoid when the tripping condition is satisfied; and an electrical energy store, to charge to a voltage before the tripping and to be discharged via the latching solenoid. After a period of time after the tripping, the voltage of the energy store is compared with a reference value and a fault signal is output if the voltage of the energy store is above the reference.

14 Claims, 1 Drawing Sheet

(51) Int. Cl.
  *H01H 50/20*   (2006.01)
  *H01H 50/32*   (2006.01)
  *H01H 50/64*   (2006.01)
  *H01H 51/01*   (2006.01)
  *G01R 31/327*  (2006.01)

(52) U.S. Cl.
  CPC ............ *H01H 50/20* (2013.01); *H01H 50/32* (2013.01); *H01H 50/64* (2013.01); *H01H 51/01* (2013.01)

(58) Field of Classification Search
  USPC ..................................... 324/424; 361/42, 45
  See application file for complete search history.

(56) References Cited

U.S. PATENT DOCUMENTS

| | | | |
|---|---|---|---|
| 2006/0125622 A1* | 6/2006 | Baldwin | |
| 2007/0223172 A1* | 9/2007 | Gauxmann | |
| 2008/0110732 A1 | 5/2008 | Adunka et al. | |
| 2011/0058300 A1* | 3/2011 | Krauss | |

FOREIGN PATENT DOCUMENTS

| | | |
|---|---|---|
| CN | 103165342 | 6/2013 |
| CN | 203118867 | 8/2013 |
| DE | 19954037 A1 | 5/2001 |
| EP | 2667207 A1 | 11/2013 |

OTHER PUBLICATIONS

Office Action dated Jul. 30, 2018 in Chinese Application No. 201510363653.0.

\* cited by examiner

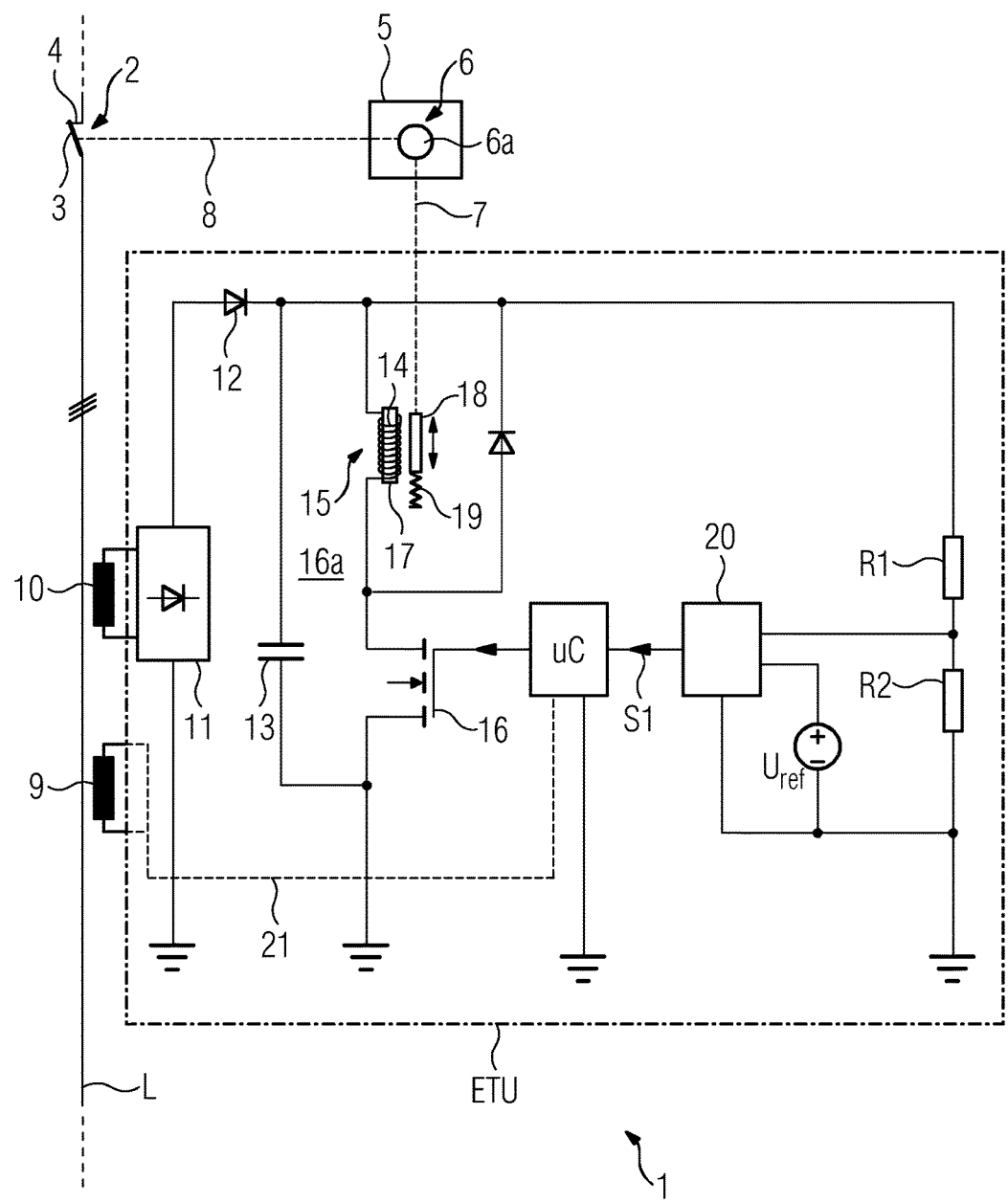

METHOD FOR TESTING A LATCHING SOLENOID OF A SWITCH AND TESTING DEVICE FOR CARRYING OUT THE METHOD

PRIORITY STATEMENT

The present application hereby claims priority under 35 U.S.C. § 119 to German patent application number DE 102014206367.1 filed Apr. 3, 2014, the entire contents of which are hereby incorporated herein by reference.

FIELD

At least one embodiment of the invention generally relates to a method for testing a latching solenoid of a switch and/or to a testing device for carrying out the method according to an embodiment of the application.

BACKGROUND

Switches in the low-voltage range with electromechanical trips are known for example as miniature circuit breakers. These interrupt the flowing current, for example when a predetermined current value is exceeded. The trip comprises a trip unit, which is formed as a latching solenoid (maglatch), which has a permanent magnet, a winding and a ferromagnetic push rod, the push rod being attracted by the magnetic field of the permanent magnet counter to the force of a spring. The tripping takes place by the winding that is arranged on the permanent magnet generating an opposing magnetic field, which compensates for the magnetic field of the permanent magnet in the region of the push rod in such a way that the push rod is displaced by the spring in the direction of its longitudinal axis to trip the switch. The push rod in this case interacts with a breaker mechanism, in which a breaker shaft is kept under mechanical prestress and unlatches the push rod. The breaker shaft rotating about its longitudinal axis separates the contact elements, and thus opens the switch.

For testing the latching solenoid, i.e. in particular the winding for wire rupture, it is known to send through the winding a steady-state test current that is too small to release the push rod. The test current is monitored, an interruption of the current particularly indicating a wire rupture.

A disadvantage of this is that the testing is relatively complex.

SUMMARY

An embodiment of the invention involves simplifying the testing of the latching solenoid.

Embodiments are directed to a method and a testing device. The dependent claims present advantageous refinements.

A solution provides with respect to the method that, after a predetermined period of time after tripping, the voltage of the energy store is compared with a predetermined threshold value and a fault signal is output if the voltage of the store is still above the threshold value.

BRIEF DESCRIPTION OF THE DRAWINGS

The invention is described in more detail below on the basis of an example embodiment.

The single FIGURE shows a switch 1, which is formed as a miniature circuit breaker for low voltages. The switch 1 has a switching contact 2 with mechanical contact elements 3, 4, which lie against one another when the switching contact 2 is closed, as represented in the FIGURE. The switching contact 2 is connected into a line L. In order to interrupt the current flowing through the line L, the switching contact 2 is opened by the contact elements 3, 4 being separated from one another.

DETAILED DESCRIPTION OF THE EXAMPLE EMBODIMENTS

Various example embodiments will now be described more fully with reference to the accompanying drawings in which only some example embodiments are shown. Specific structural and functional details disclosed herein are merely representative for purposes of describing example embodiments. The present invention, however, may be embodied in many alternate forms and should not be construed as limited to only the example embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the present invention to the particular forms disclosed. On the contrary, example embodiments are to cover all modifications, equivalents, and alternatives falling within the scope of the invention. Like numbers refer to like elements throughout the description of the figures.

Before discussing example embodiments in more detail, it is noted that some example embodiments are described as processes or methods depicted as flowcharts. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the FIGURE. The processes may correspond to methods, functions, procedures, subroutines, subprograms, etc.

Methods discussed below, some of which are illustrated by the flow charts, may be implemented by hardware, software, firmware, middleware, microcode, hardware description languages, or any combination thereof. When implemented in software, firmware, middleware or microcode, the program code or code segments to perform the necessary tasks will be stored in a machine or computer readable medium such as a storage medium or non-transitory computer readable medium. A processor(s) will perform the necessary tasks.

Specific structural and functional details disclosed herein are merely representative for purposes of describing example embodiments of the present invention. This invention may, however, be embodied in many alternate forms and should not be construed as limited to only the embodiments set forth herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Portions of the example embodiments and corresponding detailed description may be presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

In the following description, illustrative embodiments may be described with reference to acts and symbolic representations of operations (e.g., in the form of flowcharts) that may be implemented as program modules or functional processes include routines, programs, objects, components, data structures, etc., that perform particular tasks or implement particular abstract data types and may be implemented using existing hardware at existing network elements. Such existing hardware may include one or more Central Processing Units (CPUs), digital signal processors (DSPs), application-specific-integrated-circuits, field programmable gate arrays (FPGAs) computers or the like.

Note also that the software implemented aspects of the example embodiments may be typically encoded on some form of program storage medium or implemented over some type of transmission medium. The program storage medium (e.g., non-transitory storage medium) may be magnetic (e.g., a floppy disk or a hard drive) or optical (e.g., a compact disk read only memory, or "CD ROM"), and may be read only or random access. Similarly, the transmission medium may be twisted wire pairs, coaxial cable, optical fiber, or some other suitable transmission medium known to the art. The example embodiments not limited by these aspects of any given implementation.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" of "displaying" or the like, refer to the action and processes of a computer system, or similar electronic computing device/ hardware, that manipulates and transforms data represented as physical, electronic quantities within the computer system's registers and memories into other data similarly represented as physical quantities within the computer system memories or registers or other such information storage, transmission or display devices.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein are interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

The solution provides with respect to the testing device that, after a predetermined period of time after the tripping, a comparator compares the voltage of the energy store with a predetermined reference value and the output of a fault signal takes place if the voltage of the store is still above the reference value.

In the case of a simple embodiment, a technical latching solenoid has a permanent magnet, which, on account of the magnetic field, attracts a push rod counter to a resilient force.

In the simplest case, a spring generates the resilient opposing force.

In the case of a latching solenoid of a simple embodiment, it has a winding via which the energy store is discharged, the discharge weakening the magnetic force of the permanent magnet by the opposing magnetic field of the winding flowed through by current, in such a way that the push rod comes away from the permanent magnet.

In order to apply the corresponding forces when opening the switch, it is proposed that the actuator comprises a breaker mechanism, which is kept under prestress and is unlatched by way of the push rod.

The testing can be simplified in terms of hardware if the trip unit has a processor, which closes a circuit to discharge the energy store via the winding.

In the simplest case, the energy store is an electrical capacitor.

The switch 1 also has an associated electronic trip unit ETU, which respectively monitors the current passing via the switching contact 2 (the contact elements 3, 4 lying against one another) and thereby tests whether a predetermined current-dependent tripping condition is satisfied. By way of example, here the tripping condition is the exceeding of a predetermined current threshold value.

Serving for sensing the current flowing through the conductor L is the voltage signal, proportional to the current, of a sensor coil 9, which is arranged in the magnetic field (in the region) of the conductor L.

The trip unit ETU interacts with an actuator 5, which comprises a breaker mechanism 6 with a breaker shaft 6a, which is kept under mechanical prestress and, after tripping of the actuator 5, opens the switching contact 2. The interaction between the trip unit ETU and the actuator 5 and between the actuator 5 and the switching contact is schematically represented in the FIGURE by the dashed connecting lines 7, 8.

Serving for supplying energy to the trip unit ETU is a winding 10, which is wound around the conductor L and, in the manner of a transformer, couples out electrical energy from the conductor L, which passes it on to a rectifier unit 11. The rectifier voltage of the rectifier unit 11 charges a capacitor 13 via a diode 12.

In parallel with the capacitor 13, a winding 14 of a latching solenoid 15 is connected in series with a transistor switch 16. When the transistor switch 16 is closed, the capacitor 13 and the latching solenoid 15 (the winding 14 thereof) form a closed circuit 16a, i.e. the capacitor 13 is in the discharging mode.

The latching solenoid 15 also has an associated permanent magnet 17, which here is wound around by the winding 14. A push rod 18 is magnetically attracted by the permanent magnet 17 counter to the force of a spring 19, and is thereby securely held. When the transistor switch 16 is closed, the discharging current of the capacitor 13 flows through the winding 14 and builds up an opposing magnetic field, which weakens the magnetic field of the permanent magnet 17 in such a way that the magnetic force of the permanent magnet 17 is no longer sufficient for securely holding the push rod 18. The released push rod 18 moves toward the breaker shaft 6a of the breaker mechanism 6 and unlatches the breaker mechanism 6. The thereby initiated rotation of the breaker shaft 6a about its longitudinal axis opens the switching contact 2.

The closing of the transistor switch 16 takes place by a microcontroller uC when the tripping condition is satisfied, the testing of the tripping condition being carried out by software, to be precise on the basis of the voltage signal emitted by the sensor coil 9 (schematically represented as dashed line 21).

A comparator 20 respectively monitors the voltage of the capacitor 13 and compares it with a reference voltage Uref, the voltage of the capacitor 13 being adapted to the reference voltage Uref via a voltage divider with the resistors R1, R2. The reference voltage Uref forms a predetermined reference value. The comparator 20 signals (signal S1) to the microcontroller uC in each case whether the voltage of the capacitor 13 is greater than, equal to or smaller than the reference voltage Uref.

After a predetermined time after the tripping (here after 4 ms), the microcontroller uC respectively tests on the basis of the signal S1 whether the voltage of the capacitor 13 is greater than the reference voltage Uref. If this is the case, the capacitor 13 has not yet discharged and there is a fault, in particular in the form of a wire rupture of the winding 14. This fault is immediately signaled by the microcontroller uC, i.e. output as a fault signal.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A method for testing a winding for wire rupture of a latching solenoid of a switch, wherein the latching solenoid includes a permanent magnet and the switch including a switching contact formed by contact elements which are mechanically separated from one another to open the switching contact in a conductor having a magnetic field region; a sensor coil, in the magnetic field region, configured to sense current flowing through the conductor and to emit a voltage signal proportional to current of the sensor coil; an electronic trip unit, by which current passing via the contact elements is respectively monitored and it is tested whether a current-dependent tripping condition is satisfied; an actuator, actuatable by the electronic trip unit via the latching solenoid when the tripping condition is satisfied and by which the contact elements are separated after actuation; an electrical energy store, chargeable to a voltage before the tripping and dischargeable via the latching solenoid to separate the contact elements, and a transistor switch connected to the energy store and to the winding of the latching solenoid, the method comprising:

closing, after the tripping condition is satisfied, the transistor switch and creating a closed circuit including the transistor switch, the electrical energy store and the winding of the latching solenoid;

comparing, after a period of time after tripping, the voltage of the energy store with a reference value;

determining whether a wire rupture of the winding exists on the basis of whether the voltage of the energy store is greater than, equal to and smaller than the reference value;

outputting a fault signal if the voltage of the energy store is above the reference value; and wherein the fault signal indicates a non-discharging of the energy store due to a wire rupture of the winding of the latching solenoid.

2. The method for testing a winding for wire rupture of a latching solenoid of a switch of claim 1, wherein the tripping condition includes actuating the actuator via the latching solenoid.

3. A testing device for testing a winding for wire rupture of a latching solenoid of a switch, wherein the latching solenoid includes a permanent magnet and the switch including a switching contact in a conductor, the conductor having a magnetic field region and formed by contact elements which are mechanically separated from one another when the switching contact is open; an electronic trip unit, to respectively monitor current passing via the contact elements and to test whether a current-dependent tripping condition is satisfied; an actuator, configured to separate the contact elements after actuation, the electronic trip unit being configured to actuate the actuator via the latching solenoid when the tripping condition is satisfied; an electrical energy store, charging of the electrical energy store to a voltage takes place before the tripping, configured to be discharged via the latching solenoid to separate the contact elements, and a transistor switch connected to the energy store and to the winding of the latching solenoid, the testing device comprising:

a sensor coil, in the magnetic field region, which is configured to sense current flowing through the conductor and to emit a voltage signal proportional to current of the sensor coil;

a comparator to, after a predetermined period of time after the tripping, compare the voltage of the energy store with a reference value, a fault signal being output if the voltage of the energy store is above the reference value; and a processor configured to
close, after the tripping condition is satisfied, the transistor switch and creating a closed circuit including the transistor switch, the electrical energy store and the winding of the latching solenoid;
determine whether a wire rupture of the winding exists based on whether the voltage of the energy store is greater than, equal to or smaller than the reference value,
output a fault signal indicative of the wire rupture if the voltage of the energy store is above the reference value,
wherein the fault signal indicates a non-discharging of the energy store due to a wire rupture of the winding of the latching solenoid.

4. The testing device of claim 3, wherein the permanent magnet, which on account of its magnetic field, is configured to attract a push rod counter to a resilient force.

5. The testing device of claim 4, further comprising a spring to generate the resilient force.

6. The testing device of claim 4, wherein the latching solenoid includes a winding, via which the energy store is dischargeable, the discharge weakening the magnetic force of the permanent magnet by the opposing magnetic field of the winding flowed through by current, in such a way that the push rod comes away from the permanent magnet.

7. The testing device of claim 4, wherein the actuator includes a breaker mechanism, kept under prestress and unlatchable via the push rod.

8. The testing device of claim 4, wherein the trip unit includes the processor, which is further configured to
close a circuit to discharge the energy store via the winding.

9. The testing device of claim 4, wherein the energy store is an electrical capacitor.

10. The testing device of claim 3, wherein the latching solenoid includes the winding, via which the energy store is dischargeable, the discharge weakening the magnetic force of the permanent magnet by the opposing magnetic field of the winding flowed through by current, in such a way that a push rod comes away from the permanent magnet.

11. The testing device of claim 3, wherein the actuator includes a breaker mechanism, kept under prestress and unlatchable via a push rod.

12. The testing device of claim 3, wherein the processor is further configured to close a circuit to discharge the energy store via the winding.

13. The testing device of claim 3, wherein the energy store is an electrical capacitor.

14. The testing device of claim 3, wherein the tripping condition includes actuating the actuator via the latching solenoid.

* * * * *